(12) United States Patent
Bargfrede et al.

(10) Patent No.: US 7,802,214 B2
(45) Date of Patent: Sep. 21, 2010

(54) METHODS AND APPARATUSES FOR TIMING ANALYSIS OF ELECTRONICS CIRCUITS

(75) Inventors: Jens Bargfrede, Bremen (DE); Michael Mirbeth, Steindorf (DE); Stefan Bergler, München (DE); Alfred Lang, Weilheim (DE)

(73) Assignee: Infineon Technologies AG, Munich (DE)

( * ) Notice: Subject to any disclaimer, the term of this patent is extended or adjusted under 35 U.S.C. 154(b) by 126 days.

(21) Appl. No.: 11/635,371

(22) Filed: Dec. 7, 2006

(65) Prior Publication Data

US 2008/0141199 A1    Jun. 12, 2008

(51) Int. Cl.
G06F 17/50    (2006.01)
(52) U.S. Cl. ............................................. 716/6
(58) Field of Classification Search ............... 716/1–18
See application file for complete search history.

(56) References Cited

U.S. PATENT DOCUMENTS

| | | | |
|---|---|---|---|
| 4,263,651 A | 4/1981 | Donath et al. | |
| 2003/0115035 A1* | 6/2003 | Kulshreshtha et al. | 703/19 |
| 2003/0125914 A1* | 7/2003 | Du | 703/2 |
| 2006/0026543 A1* | 2/2006 | Jayaraman et al. | 716/6 |
| 2006/0117287 A1 | 6/2006 | Bergler et al. | |
| 2007/0226668 A1* | 9/2007 | Dasdan et al. | 716/6 |

FOREIGN PATENT DOCUMENTS

DE    10 2004 044 668 A1    3/2006

OTHER PUBLICATIONS

Hashimoto et al., Equivalent Waveform Propagation for Static Timing Analysis, IEEE Transactions on Computer-aided Design of Integrated Circuits and Systems, vol. 23, No. 4, Apr. 2004, pp. 498-508.*
Odabasioglu et al., "PRIMA: Passive Reduced-Order Interconnect Macromodeling Algorithm", IEEE Transactions on Computer-Aided Design of Integrated Circuits and Systems, vol. 17, No. 8, pp. 645-654, 1998.*
Hitchcock, Robert B., Sr., "Timing Verification and the Timing Analysis Program," 19th Design Automation Conference, IBM General Technology Division, Endicott, New York 13760, Paper 34.2, pp. 594-604.
Abstract, "Synopsis—CCS Timing Liberty Syntax," Synopsys, Inc., Mountain View, California, Nov. 9, 2005, pp. 1-21.
Abstract, "Synopsis—CCS Timing Technical White Paper," Version 1.0, Synopsys, Inc., Mountain View, California, Nov. 8, 2005, pp. 1-14.
McMurchie et al., "WTA—Waveform-Based Timing Analysis for Deep Submicron Circuits," Department of Electrical Engineering, University of Washington, Seattle, Washington, 2002 IEEE, pp. 625-631.
Internet article, "Static Timing Analysis," from Wikipedia (http://en.wikipedia.org/wiki/Static_timing_analysis), three pages.
Blaauw, David, "Slope Propagation in Static Timing Analysis," IEEE Transactions on Computer-Aided Design of Integrated Circuits and Systems, vol. 21, No. 10, Oct. 2002, pp. 1180-1195.

* cited by examiner

*Primary Examiner*—Vuthe Siek
*Assistant Examiner*—Aric Lin
(74) *Attorney, Agent, or Firm*—Brinks Hofer Gilson & Lione

(57) ABSTRACT

Methods and apparatuses for performing timing analyses of an electronic circuit are provided. Waveforms of signals in the circuit are determined, and timing checks are performed based on these waveforms.

18 Claims, 5 Drawing Sheets

METHODS AND APPARATUSES FOR TIMING ANALYSIS OF ELECTRONICS CIRCUITS

RELATED APPLICATIONS

This application is related to U.S. patent application Ser. No. 11/635,380, "Methods and Apparatuses for Timing Analysis of Electronic Circuits," filed on even date herewith, the contents of which are incorporated by reference in their entirety herein.

BACKGROUND

1. Technical Field

The present invention relates to methods and apparatuses for timing analysis of electronic circuits. In particular, the present invention relates to a system for performing timing analysis using a simulated waveform.

2. Background Information

Timing analysis in general is used in the context of analysis of electronic circuits, for example during the design of electronic circuits. In such electronic circuits, the timing of the circuit has to be checked such that signals generated by one circuit element reach another circuit element at an appropriate time. A simple example for this situation is shown in FIG. 1, where a circuit element 24 generates a signal d to be sampled in a flipflop 23 depending on a clock signal clk. In other words, at a time defined by the clock signal clk, flipflop 23 samples signal d and outputs the sampled value q. To ensure a correct sampling of the signal d, the signal d has to be present in a steady state (i.e. without state transitions) a certain time before and after the sampling time defined by the clock signal clk. The time during which signal d is present before the sampling time is commonly referred to as setup time, whereas the time during which the signal d is present after the sampling time is referred to as hold time.

When designing electronic circuits, it is desired to evaluate the functioning of the circuit as soon as possible before the actual physical implementation of the circuit. A general method for evaluating circuits is so-called analog simulation, where a transistor level netlist of a circuit is processed. The components of the circuit like transistors are represented as differential equations, wherein a single transistor may be characterized by a plurality of parameters. Analog simulation then solves these differential equations for example by employing a time step method.

However, for modern electronic integrated circuits like microprocessors which may comprise millions of transistors being interconnected a full analog simulation for all possible inputs of the circuit with current computing equipment would take too much time to be practical. Therefore, to perform a timing analysis of complex circuits, for example synchronous digital circuits, so-called static timing analysis (STA) is conventionally employed. In static timing analysis, the basic principle is to only consider so-called "extremal" timing events and not to analyze all possible input patterns at input terminals of a circuit design concurrently. In particular, no series of switchings at an input is analyzed, but only a single switching of one (or possibly more) input(s), while the remaining input(s) are held constant. Extremal timing events in this respect are those input patterns which lead to the earliest or latest arrival of a signal at a given receiver cell like flipflop 23 of FIG. 1. If these earliest and latest arrivals fulfill the timing requirements of the circuit regarding arrival time, all other timing events or configurations are assumed to also fulfill the requirements. The computational effort of static timing analysis is linear with respect to the complexity of the design and not exponential as it would be for a full analog simulation.

In conventional static timing analysis, a circuit design is broken down into so-called stages, a stage being defined as a circuit portion having an input which may be an input of a so-called driving cell generating a signal and at least one output, the outputs being either outputs of the circuit or connected to inputs of further circuit elements designated receiver cells. For example, FIG. 1 may be seen as representing such a stage, where circuit element 24 is the driver cell and flipflop 23 is the receiver cell. The circuit design is then processed stage by stage according to a so-called topological sorting of the stages starting at the input terminals of the electronic circuits such that the input signal for a subsequent stage is available for the processing of said subsequent stage.

In static timing analysis first of all the propagation of the signals through the stages, for example through gates and networks in the stages, is calculated independently of a clock signal, this step being designated delay calculation. Then, these results are evaluated in the context of the clock signals and further design constraints used, for example to evaluate whether a signal fulfils the setup time and hold time requirements for a given clock signal.

In conventional static timing analysis signal transitions from one state to another state (i.e. from a logical 0 to a logic 1 in the case of a digital signal) are approximated as ramps, and in the case of voltage signals a single voltage point is conventionally taken as a delay threshold for delay measurement of the transition. This situation is depicted in FIG. 2, where a signal 21 changes from 0 representing a logic 0 to a positive voltage VDD representing a logic 1. In the exemplary diagram of FIG. 2, the ramp of signal 21 is chosen such that it crosses the actual signal which corresponds to curve 22 at voltage Vl, Vh. Vl may be set to 10% of VDD, and Vh may be set to 90% of VDD. The time between signal 21 reaching Vl and signal 21 reaching Vh is taken as a transition time, in the present case indicating the time necessary to change from a logic 0 to a logic 1. The delay threshold in the example shown is set to the point where signal 21 crosses VT=VDD/2, the corresponding delay time being designated t1 in FIG. 2. However, other values for VT may also be chosen. Therefore, in static timing analysis it would for example be evaluated whether t1 is within a desired time frame to meet, for example, a required setup time. Through the approximation of signals as ramps, the signals may be characterized by a single parameter like the above-mentioned transition time or slew or by only a few parameters.

Additionally, static timing analysis uses a library where the electrical or timing characteristics of a plurality of possible cells like flipflops, combinational gates or other circuit elements which may comprise a plurality of transistors are stored. When processing a stage, the characteristics of the cells of this stage are taken from the library.

As circuits become more and more complex and clock rates increase, timing in circuits often becomes more critical. Therefore, there exists a general need for methods and apparatuses for timing analysis of electronic circuits which allow a precise analysis even of complex circuits.

BRIEF SUMMARY

A method for performing a timing analysis of an electronic circuit is disclosed. The method includes simulating a waveform of a signal propagating in said electronic circuit; and performing a timing check based on said simulated waveform.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

Embodiments of the present invention will be described hereinafter with reference to the accompanying drawings which are to be taken as an example only and not to be construed as limitative, wherein:

FIGS. 4a and 4b are exemplary diagrams for showing a pulse construction, wherein FIG. 4a shows waveforms with a rising and a falling edge, respectively, and FIG. 4b shows the construction of a pulse from the waveforms of FIG. 4a.

DETAILED DESCRIPTION

In embodiments of the present invention, signal waveforms, for example slopes of signals when changing from a logic 0 to a logic 1, are calculated by a simulation. This simulation, in embodiments of the present invention, may be an analog simulation based on a transistor level netlist of the electronic circuit which is performed within the timing analysis process. However, other kinds of simulations like FAST MOS simulation may also be employed. In general, simulation in the context of the present application refers to any method which is able to model a signal waveform with a controlled stepsize to achieve a desired accuracy. Stepsize in this respect designates the distance in time between two signal values determined by the simulation. This stepsize may in some simulations vary such that almost linear parts of the signal waveform are determined using a comparatively large stepsize, while parts having a high curvature are determined using a comparatively small stepsize. These calculated signal waveforms are then used for performing the static timing analysis itself. In such embodiments, the signal waveforms may be applied to inputs or circuit nodes of the circuit (like a data input of a flipflop) to perform the timing check.

As can be seen from the above explanations, embodiments of the present invention may in particular be implemented as a modification to conventional timing analysis, wherein the use and look-up of approximated signal waveforms or slopes and the corresponding behavior of cells of the circuit in tables is replaced by the above-mentioned simulation.

In corresponding embodiments of the present invention, the timing check itself may be performed according to conventional static timing analysis.

Figure 1:
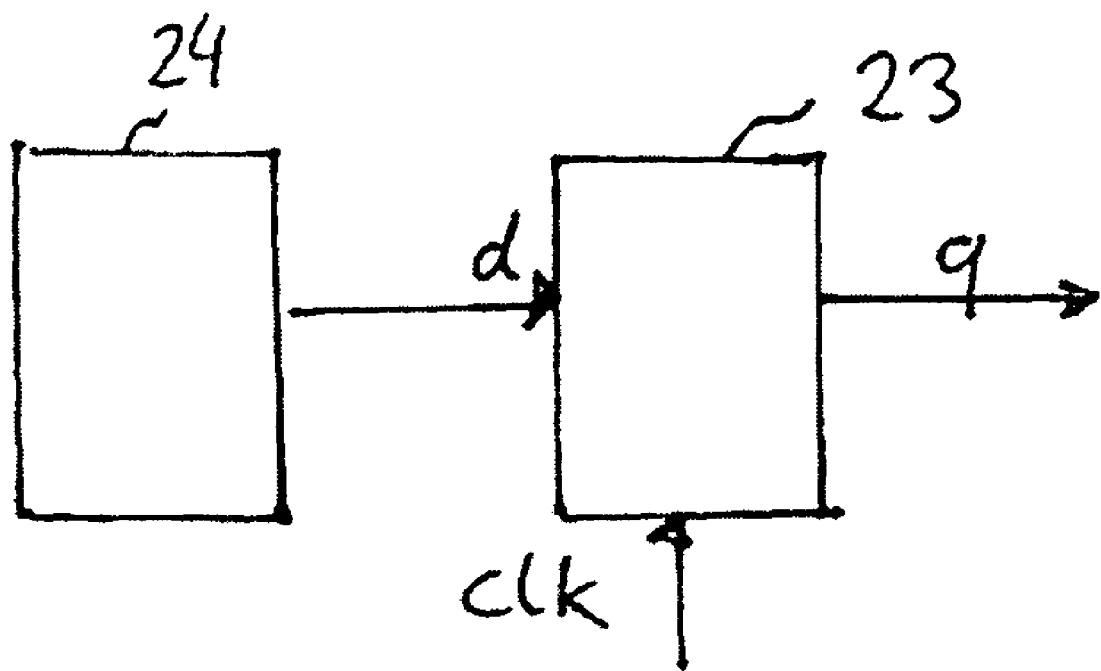
FIG. 1 schematically shows a flip-flop unit illustrating principles of timing analysis.

In further embodiments of the present invention, for performing the timing check itself also an analog simulation is performed. In FIG. 1, this would mean performing an analog simulation of flipflop 23 to determine whether the timing requirements are met. In the course of this simulation, the signal q would be calculated. In embodiments of the invention, this signal q is then again stored for further reference or used in the analysis of subsequent stages.

By performing the timing check by a simulation, the timing check may be performed specific to the cell or circuit element when the timing is critical, wherein the point where the signal waveform is analyzed may be within the respective cell or at input pins of the respective cell.

The effect of these embodiments will be illustrated by again referring to FIG. 2. As already described above, signal 21 represents a signal with a slope as for example determined using a library, for example a signal output by a circuit element and fed to a further circuit element, resulting in a delay time of t1. By performing a simulation of the circuit element to determine the signal, a more precise waveform like signal waveform 22 represented in FIG. 2 may result. This, as can also be easily seen in FIG. 2, would lead to a modified transition time t2 differing from t1 by $\Delta t$ which, in the case of critical timing paths, leads to more precise results, in particular when $\Delta t$ becomes non-negligible compared to the transition time of the signal. In other words, in embodiments of the invention predetermined input waveforms like ramps are only used at the external inputs of the circuit under examination, while within the circuit simulated waveforms are used. It should be noted that, while times like t2 may be determined in embodiments to be able to perform a comparison with conventional techniques, it is not necessary to characterize the waveform by such parameters since the full simulated waveform is available.

Figure 2:
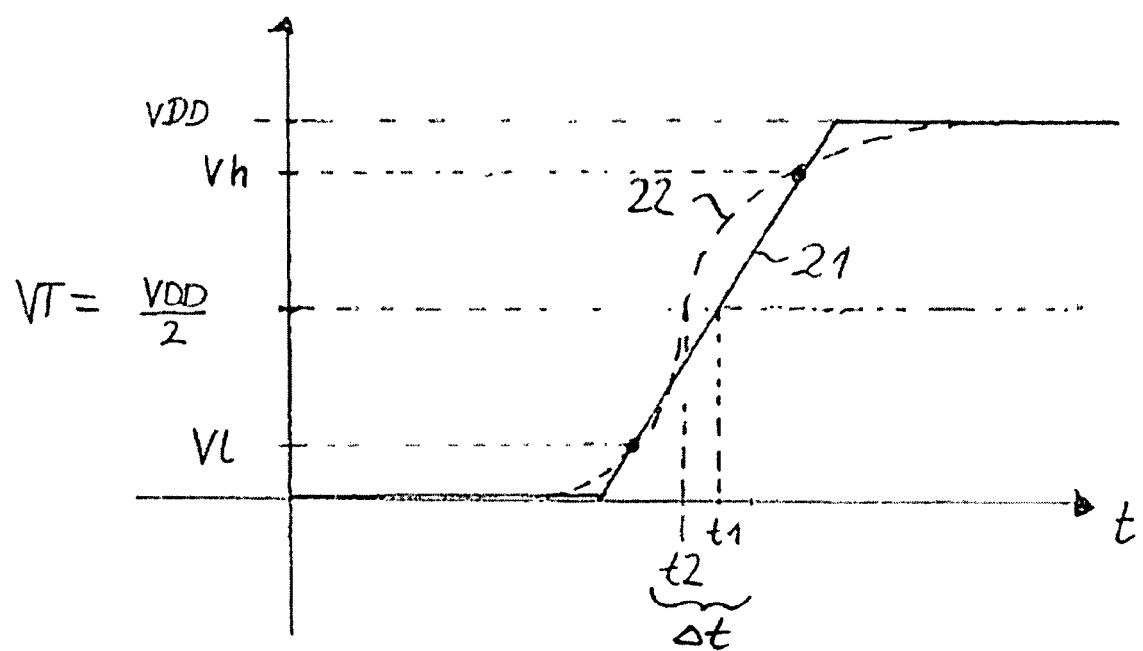
FIG. 2 is a diagram showing slopes of signals.

In embodiments of the invention, the simulated signal waveforms like waveform 22 of FIG. 2 may be sampled and stored in a storage. In this case, as much information may be stored as necessary for recovering the waveform with a desired accuracy, e.g. an accuracy sufficient for not introducing any significant errors. These sampled values then, in further embodiments, may be used at inputs for further stages of the circuit under evaluation. For example, taking the simple circuit of FIG. 1 as a stage, the waveform of signal d would be calculated by performing a simulation of circuit element 24. Then, using this signal waveform, a timing check is performed for flipflop 23, for example by evaluating if the transition of signal d occurs at a time satisfying the setup time requirement of flip-flop 23. Then, when analyzing a subsequent stage where flipflop 23 is driver cell, i.e. where signal q output from flipflop 23 has to drive a further circuit element like a combinational gate or a further flipflop, the stored waveform of signal d is taken as an input to flipflop 23, and then the waveform of signal q is obtained by again performing a simulation.

As explained, with the above-described embodiments it can be checked whether a rising edge of a signal as shown in FIG. 2 fulfills a setup time requirement. However, the embodiment is not limited to setup checks, but may also be used to perform other timing checks, for example a hold check. Such a hold check may again be explained with reference to FIG. 2. Assuming that the state where the signal assumes a 0 in FIG. 2 is to be sampled, performing a hold check in this case would mean testing if the 0 is held long enough in order to ensure a correct sampling before the transition to 1 occurs. The same checks, as a matter of course, may also be performed when the waveform comprises a falling edge of the signal instead of the rising edge shown in FIG. 2.

In further embodiments which may be combined with the above-mentioned embodiments but which also may be implemented separate therefrom, a combined check is performed for setup and hold time. In these embodiments, a combined signal is formed comprising both a waveform which establishes a state (for example a rising edge to establish a state of logic 1) and a waveform terminating that state (for example a falling edge from logic 1 to logic 0). The timing check is then carried out using this combined signal such that setup and hold time can be checked simultaneously with the combined signal.

For example, if, assuming that all relevant circuit parts are driven by the same clock signal, in the above example at a clock n the rising edge is present establishing the state to be sampled and at a clock m the falling edge is present, the combined signal would comprise the rising edge followed, after m-n clock cycles, by the falling edge.

In such embodiments, the effect can be used that smaller setup times to a certain extent can be compensated by longer hold times and vice versa. Therefore, by combining the waveform establishing a state, for example a state to be sampled, and a waveform terminating that state, a high accuracy in detecting setup time or hold time violations can be obtained. Since the above-mentioned compensation is possible, the risk that signals which do not constitute a setup or hold time violation are recognized as signals causing a setup or hold time violation is minimized.

Also in this case, in embodiments of the present invention the waveform of the combined signal may be stored, and also in embodiments of the present invention the combined waveform may be used to evaluate the timing via a further simulation as described above for single waveforms.

This concept shall be further explained with reference to FIGS. 3, 4a and 4b.

Figure 3:
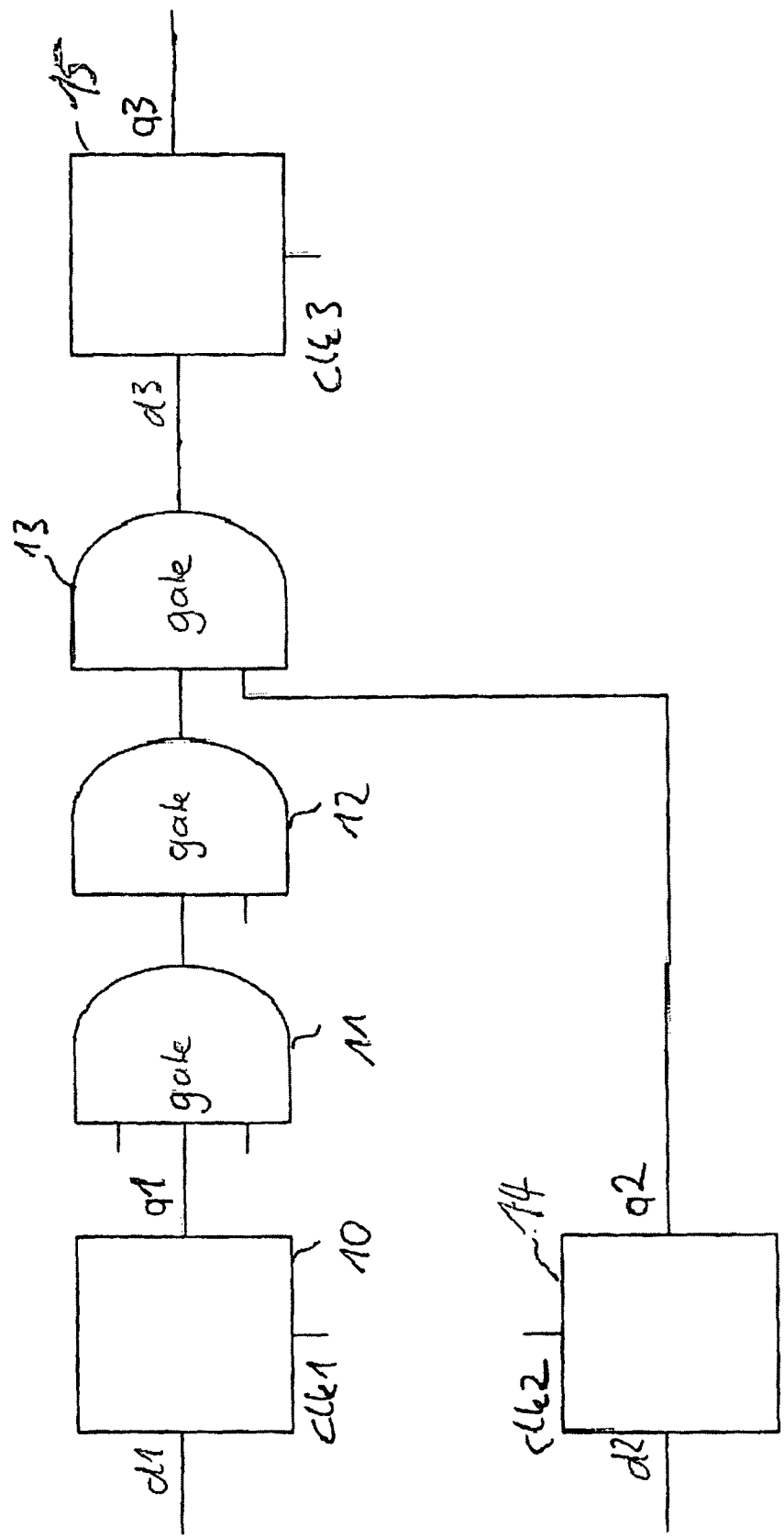
FIG. 3 is a circuit diagram.

FIG. 3 shows a circuit diagram of a synchronous digital circuit which in the following will be used for explaining the principle of combined signal waveforms.

The circuit shown in FIG. 3 comprises a first flipflop 10, gates 11, 12 and 13, a second flipflop 14 and a third flipflop 15. The circuit of FIG. 3 is used only as an example for illustrating an embodiment of the invention. Therefore, for clarity sake parasitic elements like resistances, capacitances or inductances have been omitted. Nevertheless, such elements also may be taken into account in the simulations of embodiments of the present invention.

A signal d1 is sampled at a data input of first flipflop 10 according to a first clock signal clk1, and the sampled value is output as a signal q1. Signal q1 is fed to a chain of the three gates 11, 12 and 13. An output of gate 13 is coupled with a data input of third flipflop 15, the signal supplied thereto being designated as d3.

Gates 11, 12 and 13 may be any kind of logic gates combining the signals supplied thereto. For the present example, it may for example be assumed that gates 11 and 12 are OR-gates, while gate 13 is an AND-gate. The signals supplied to the further inputs of gates 11 and 12 are not relevant for the explanation which will follow and may assume any state.

Furthermore, a signal d2 is fed to a data input of second flip-flop 14 and sampled according to a clock signal clk2. The sampled value is then output as signal q2 and fed to an input of gate 13. In the circuit shown in FIG. 3, the propagation time for signal d1 through flipflop 10, gates 11, 12 and 13 to the data input of third flipflop 15 for the exemplary circuit shown is assumed to be larger than the propagation time of signal d2 through second flipflop 14 and gate 13 to the data input of third flip-flop 15. Furthermore, for the explanation which follows, it is assumed that the clock signals clk1, clk2 and clk3 are the same clock signal. However, the concept described below is also applicable if clock signals are different, for example have predetermined phase differences or are derived from different clock sources.

For the timing check, for example a setup and hold check as already explained with reference to FIG. 1, a 0-1-0 pulse is supplied as signal d1 and d2. Four consecutive sampling points defined by the clock signal clk1, clk2, clk3 (in the following commonly referred to as clk) are designated n−2, n−1, n and n+1. Therefore, at sampling point n−2, first flipflop 10 and second flipflop 14 each sample a 0, at sampling point n−1 they sample a 1 and at sampling point n they sample a 0. Therefore, signals q1 and q2 in the respective following clock period (n−1, n, n+1) also correspond to a 0, 1, 0 pulse. Consequently, at sampling points n−1, n, n+1, third flipflop 15 should also sample 0, 1 and 0, respectively, if the timing behavior of the circuit is correct.

As explained above, in embodiments of the present invention the exact waveforms of signals q1 and q2 are determined based on an analog simulation of flipflops 10 and 14. Also the signal propagation through gates 11, 12 and 13 according to embodiments of the present invention is determined through analog simulation.

In the following, the setup and hold check for sampling the "1" of the above-mentioned pulse will be discussed as an example.

For signal d3 to represent a logic 1, both input signals of gate 13 have to correspond to a logic 1. Since, as defined above, the path from signal d1 to signal d3 is slower than the path for signal d2 to signal d3, for the establishing of a logic 1 of the data input of said flipflop 15, the signal originating from first flipflop 10 is the critical signal propagating via the extremal, i.e. longest, path. In other words, the waveform of the signal d1 as propagated through first flipflop 10 and gates 11, 12 and 13 determines the latest possible rise of the data signal at the data input of third flip-flop 13. This signal is therefore simulated or, according to other embodiments, constructed by looking up in tables and is represented as signal 31 in FIG. 4a.

This signal, according to embodiments previously discussed, may then be used for a setup check, i.e. by evaluating whether the signal arrives in time such that a required setup time of third flipflop 15 is met.

On the other hand, regarding the transition from a logic 1 back to a logic 0, the signal d2 propagating through the second flipflop 14 is the critical signal since it arrives at gate 13 and therefore at the data input of third flipflop 15 earlier than the corresponding transition of signal d1. Therefore, the falling edge of d3 is determined, for example simulated, based on output signal q2 from second flipflop 14. The result is shown as signal 32 in FIG. 4a. This signal may be used to perform a hold check in the previously discussed embodiments by checking whether the signal remains above the threshold long enough so that a required hold time of third flipflop 15 is met.

Figure 4A:
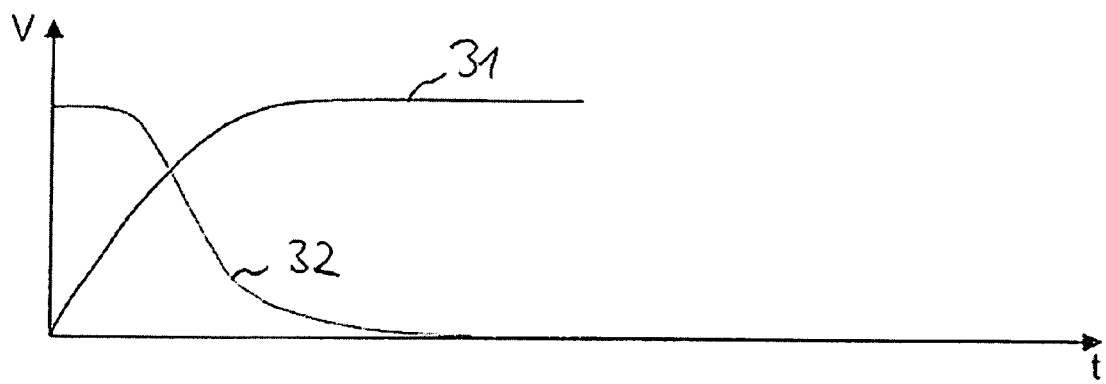
Figure 4B:
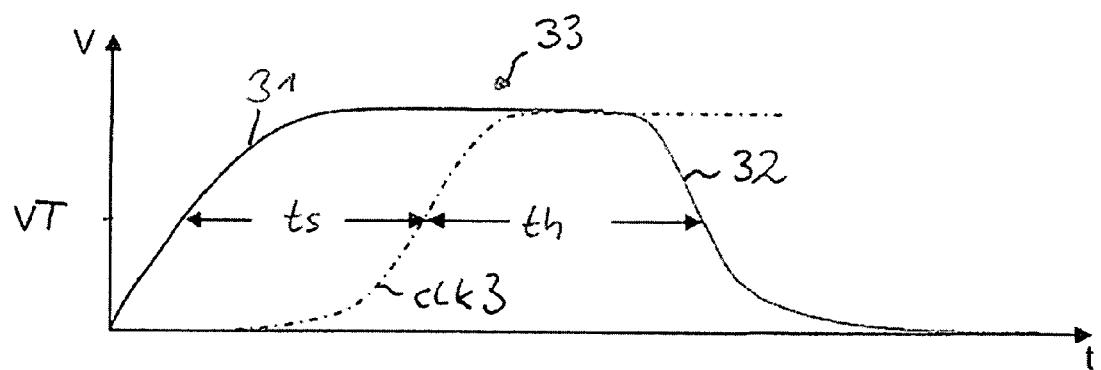

In the currently discussed embodiment where a combined signal is constructed from a signal waveform establishing a state and a signal waveform terminating a state, in the present case as shown in FIG. 4b a signal pulse 33 is constructed from rising edge 31 and falling edge 32 from FIG. 4a. To achieve this, falling edge 32 is shifted by one clock period as shown in FIG. 4b. Signal pulse 33 according to this embodiment is then used for the actual timing check, in the case of the circuit of FIG. 3 to check whether signal pulse 33 meets the setup and hold time requirements when sampled in third flipflop 15 with third clock signal clk3. Clk 3 is represented in FIG. 4b as a dashed line, the setup time being denoted ts and the hold time being denoted th.

Since in this embodiment the timing check is performed with the combined pulse 33, the setup and hold check can be performed simultaneously. One possibility is the simulation of flipflop 15 by analog simulation to see whether the combined signal, in this case the value 1, is sampled correctly. In general, since the setup and hold check is performed simultaneously by taking the "critical follow-up signal", i.e. in the present case signal 32 into account, the mutual interdependence of required setup time and required hold time can be taken into account such that a shorter setup time may be compensated by a longer hold time and vice versa.

As a matter of course, this embodiment is not restricted to a circuit like the circuit shown in FIG. 3, but may be used with any circuit where a state is established by a first signal waveform (signal 31 in the example given) and terminated by a second signal (signal 32 in the present case). Furthermore, in the currently discussed embodiment setup and hold checks are performed. In other embodiments, alternatively other types of timing checks like recovery or removal checks are performed. In such embodiments, the timing of a signal is not or not only evaluated relative to a clock signal, but (also) relative to a signal other than a clock signal. Furthermore, embodiments of the invention are not restricted to use the latest signal necessary for establishing a state and the earliest signal causing the termination of a state for construction of the combined signal, but in general may use signals being the best representations regarding the operation of the circuit for construction of combined signals.

Figure 5:
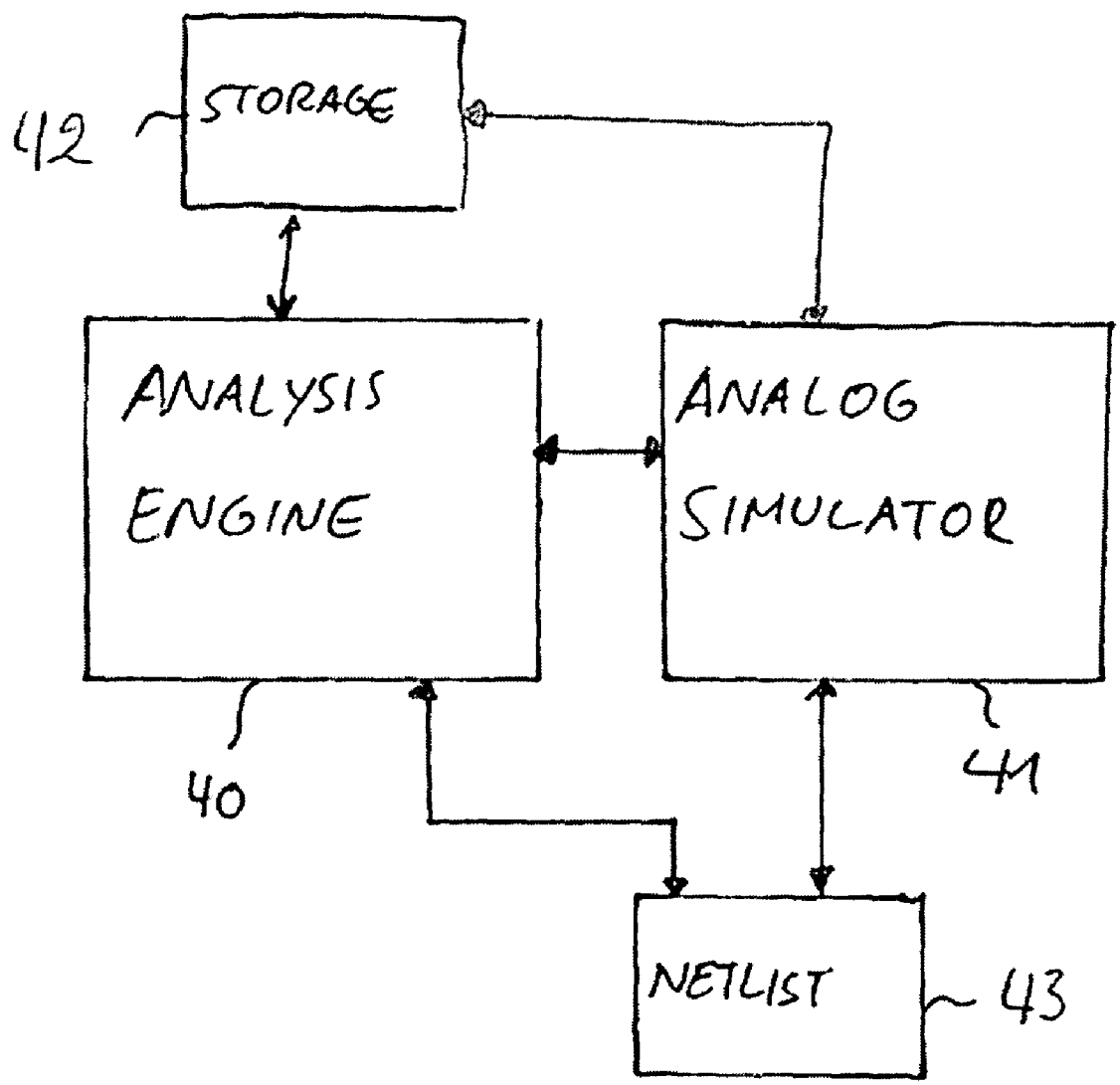
FIG. 5 is a block diagram showing an example apparatus for a timing analysis.

The above-discussed embodiments may be in particular implemented as software on a computer system like a personal computer, a mainframe computer or the like. FIG. 5 shows a schematic implementation of an embodiment of an apparatus according to the present invention which may implement a method according to any one of the previously discussed embodiments. The embodiment shown in FIG. 5 comprises an analysis engine 40, an analog simulator 41 and a storage 42. Analysis engine 40 performs a method according to an embodiment of the present invention like the methods described above. In particular, analysis engine 40 controls analog simulator 41 for performing simulations like the simulations described above. A storage 42 is provided for storing results or waveforms calculated by the analog simulator as also already described above. Analysis engine 14 and analog simulator 41 may for example be implemented as separate software modules or a single software module. Storage 42 may be any kind of storage like a random access memory, a hard disk, a flash memory or the like.

For analyzing a circuit, information 43 regarding this circuit is supplied to the apparatus comprising a transistor level netlist in the embodiment shown in FIG. 5. Information 43 may be stored on any storage medium like a CD ROM, a flash memory or the like or may be transmitted to storage 42 via a communication link like Ethernet pipes, shared memory or the like. Information 43 is then used for determining the stages and also for performing the analog simulation as explained above. Besides said netlist, information 43 may comprise clock definitions, simulation parameters, temperatures, device parameters, transistor models, information regarding parasitic elements of the circuit, information regarding so-called exceptions, side constraints and/or any other kind of information usable or necessary for performing simulations of the circuit or parts thereof.

As a matter of course, the above embodiments are only to be taken as examples and not as limitative. In particular, the various features described with respect to different embodiments may be used in combination and separately to perform timing checks in electronic circuits.

The invention claimed is:

1. A method for performing a timing analysis of an electronic circuit, the method comprising executing instructions stored on a computer-readable medium that cause a computer processor to:
   identify a first critical signal path of the electronic circuit;
   identify a second critical signal path, different from the first critical signal path, of the electronic circuit;
   determine, based on a signal propagating through the first critical signal path, a first signal waveform of a first signal establishing a state at a timing checkpoint;
   determine, based on a signal propagating through the second critical signal path, a second signal waveform of a second signal terminating said state at said timing checkpoint;
   combine the first signal waveform and the second signal waveform to form a combined signal, and
   perform a timing check at said timing checkpoint based on said combined signal.

2. The method according to claim 1, wherein said first signal comprises a latest signal necessary for establishing said state, and said second signal comprises an earliest signal causing the termination of said state.

3. The method according to claim 1, wherein said first signal comprises a representative signal for establishing said state, and said second signal comprises a representative signal for the termination of said state.

4. The method according to claim 1, wherein said determining comprises an analog simulation of at least one of said first signal waveform and said second signal waveform.

5. The method according to claim 1, wherein said timing checkpoint is located at a circuit element where a signal dependent on said first signal and said second signal is processed according to a reference signal.

6. The method according to claim 5, wherein said reference signal comprises a clock signal, and wherein performing said timing check comprises performing a combined setup and hold check.

7. The method according to claim 5, wherein said timing checkpoint is located within said circuit element.

8. The method according to claim 1, wherein combining the first signal waveform and the second signal waveform comprises shifting one of the first and second signal waveforms by a first clock period.

9. An apparatus for performing a timing analysis of an electronic circuit, comprising:
   a timing analyzer, said timing analyzer comprising an analysis module, said analysis module configured to execute instruction stored in a computer-readable medium to:
   identify a first critical signal path of the electronic circuit;
   identify a second critical signal path, different from the first critical signal path, of the electronic circuit;
   determine, based on a signal propagating through the first critical signal path, a first signal waveform of a first signal establishing a state at a timing checkpoint;
   determine, based on a signal propagating through the second critical signal path, a second signal waveform of a second signal terminating said state at said timing checkpoint;
   combining the first signal waveform and the second signal waveform to form a combined signal; and
   perform a timing check at said timing checkpoint based on said combined signal.

10. The apparatus according to claim 9, wherein said first signal comprises a latest signal for establishing said state; and
   said second signal comprises an earliest signal causing the termination of said state.

11. The apparatus according to claim 9, wherein said first signal comprises a representative signal for establishing said state, and said second signal comprises a representative signal for terminating said state.

12. The apparatus according to claim 9, wherein said instructions to determine comprise instructions to perform an analog simulation of at least one of said first signal waveform and said second signal waveform.

13. The apparatus according to claim 9, wherein said timing checkpoint comprises a location at a circuit element where a signal dependent on said first signal and said second signal is processed according to a reference signal.

14. The apparatus according to claim 13, wherein said reference signal comprises a clock signal; and wherein said instructions to perform said timing check comprise instructions to perform a combined setup and hold check.

15. The apparatus according to claim 13, wherein said timing checkpoint is located within said circuit element.

16. The apparatus according to claim 9, wherein combining the first signal waveform and the second signal waveform comprises shifting one of the first and second signal waveforms by a first clock period.

17. An apparatus for performing a timing analysis of an electronic circuit, comprising:

means for identifying a first critical signal path of the electronic circuit and for identifying a second critical signal path, different from the first critical signal path, of the electronic circuit;

means for determining, based on a signal propagating through the first critical signal path, a first signal waveform of a first signal establishing a state at a timing checkpoint, the means for determining the first signal configured to determine, based on a signal propagating through the second critical signal path, a second signal waveform of a second signal terminating said state at said timing checkpoint;

means for combining the first signal waveform and the second signal waveform to form a combined signal; and means for performing a timing check at said timing checkpoint based on said combined signal.

18. The apparatus according to claim 17, wherein combining the first signal waveform and the second signal waveform comprises shifting one of the first and second signal waveforms by a first clock period.

* * * * *